(12) United States Patent
Kim et al.

(10) Patent No.: US 8,120,433 B2
(45) Date of Patent: Feb. 21, 2012

(54) MULTI-OUTPUT OSCILLATOR USING SINGLE OSCILLATOR

(75) Inventors: Kwang-Seon Kim, Daejeon (KR); Woo-Jin Byun, Daejeon (KR); Min-Soo Kang, Daejeon (KR); Bong-Su Kim, Daejeon (KR); Tae-Jin Chung, Daejeon (KR); Myung-Sun Song, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 72 days.

(21) Appl. No.: 12/647,961

(22) Filed: Dec. 28, 2009

(65) Prior Publication Data

US 2010/0283550 A1    Nov. 11, 2010

(30) Foreign Application Priority Data

May 7, 2009    (KR) .................. 10-2009-0039888

(51) Int. Cl.
    *H03B 21/00* (2006.01)

(52) U.S. Cl. ............. 331/37; 331/42; 331/18; 331/179; 331/74; 327/105; 455/260

(58) Field of Classification Search .............. 331/2, 179, 331/46, 42, 18, 74, 37; 327/105; 455/260
See application file for complete search history.

(56) References Cited

U.S. PATENT DOCUMENTS

| | | | |
|---|---|---|---|
| 6,828,863 B2 * | 12/2004 | Itkin et al. | .................. 331/2 |
| 6,985,701 B2 | 1/2006 | Yoshida et al. | |
| 7,266,352 B2 | 9/2007 | Soe et al. | |

* cited by examiner

*Primary Examiner* — Arnold Kinkead
(74) *Attorney, Agent, or Firm* — Kile Park Goekjian Reed & McManus PLLC

(57) ABSTRACT

Provided are a multi-output oscillator using a single oscillator, and a method of generating multiple outputs. The multi-output oscillator includes: an oscillator outputting the single frequency; a multiplier multiplying the single frequency to output a first frequency; a first frequency divider dividing the single frequency by a first division factor; a first mixer outputting a second frequency by mixing an output of the first frequency divider and an output of the multiplier; a second frequency divider dividing the single frequency by a second division factor; a second mixer mixing the output of the second frequency divider and the output of the first mixer to output a third frequency; and a third mixer mixing the output of the second frequency divider and the output of the multiplier to output a fourth frequency.

13 Claims, 8 Drawing Sheets

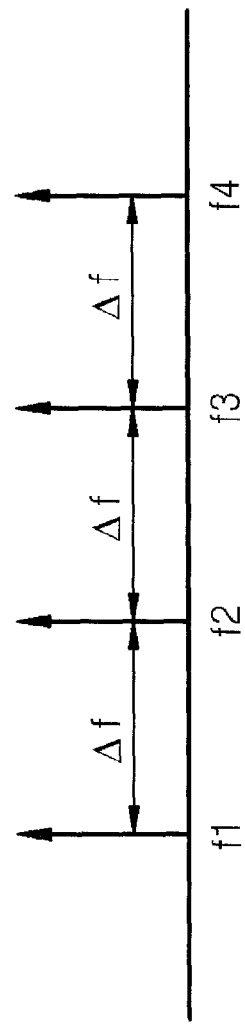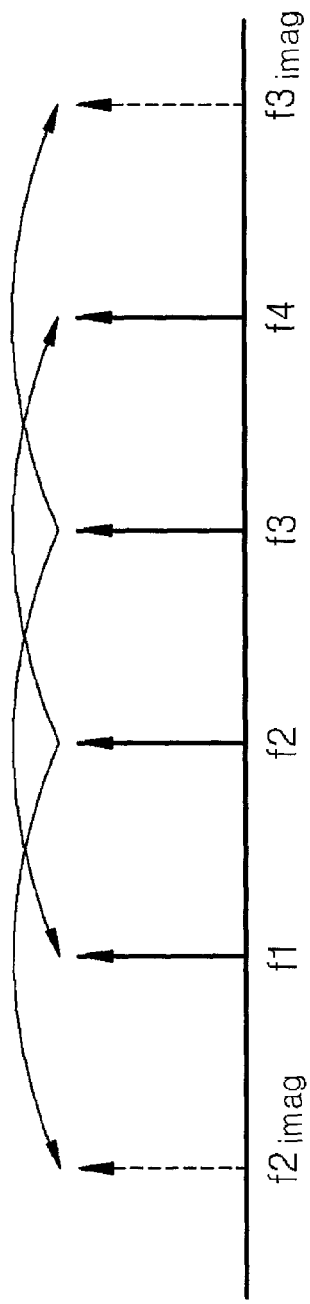

MULTI-OUTPUT OSCILLATOR USING SINGLE OSCILLATOR

CROSS-REFERENCE TO RELATED PATENT APPLICATION

This application claims the benefit of Korean Patent Application No. 10-2009-0039888, filed on May 7, 2009, in the Korean Intellectual Property Office, the disclosure of which is incorporated herein in its entirety by reference.

BACKGROUND OF THE INVENTION

1. Field of the Invention

The present invention relates to a multi-output oscillator and a method of generating multiple outputs, and more particularly, to a multi-output oscillator outputting multiple frequencies using a single frequency that is output from a single oscillator, and a method of generating multiple outputs using the same.

2. Description of the Related Art

In order to transmit super high-speed data of 10 Gbps or greater, a broad bandwidth of several GHz or greater is necessary. Such a broad bandwidth may be processed as one channel using a high-speed analog-digital converter (ADC)/digital-analog converter (DAC), or divided into multiple channels and then processed using low-speed ADC/DACs. The high-speed ADC/DAC requires expensive components, and speed-conversion to a low speed for digital processing, and parallel processing, thereby requiring a very complicated configuration. Accordingly, it is easy to implement a radio frequency (RF) system but difficult to implement a digital system. In addition, it is difficult to use various compensation methods, and thus it becomes difficult to realize the performance of the whole system.

On the other hand, it is easy to realize a method using multiple channels into a system, since the performance of the system can be maximized due to the low digital processing speed. However, when the characteristics of various paths in an RF system are to be maintained uniform, it is difficult to realize the RF system and the size of the RF system increases. In regard to the RF system, inclusion of a multi-output local oscillator with various frequencies is critical due to the complexity of the configuration of the RF system and difficulty in realizing the RF system. In particular, for the multi-output local oscillator, a simple structure, a compact size, and minimized variation in the performance of each channel are essential.

A multi-output oscillator employed in a conventional RF transceiver is implemented by arranging an individual oscillator for each frequency or by a structural solution of reducing the number of oscillators by including frequency multipliers and frequency dividers. When using the individual oscillators, an appropriate oscillator for each of the frequencies can be selected and a phase locked loop (PLL) may be used to maximize the characteristics of the multi-output local oscillator, if the range of the output frequency of the multi-output local oscillator is broad. However, the number of PLLs, which is most burdensome in designing a local oscillator, needs to be as many as the output frequencies, and the type of the local oscillator varies accordingly. Thus, the overall size of the RF system increases, and the number of portions that are to be controlled in the RF system increases as much as the number of PLLs.

When a frequency multiplier is used, a great difference is created in the phase noise characteristics of an output signal according to a multiplication number, and generating and mixing signals in a basic oscillator as many as the frequency separations between the output frequencies of a local oscillator is difficult if four or more channels are included, and image components of a mixer need to be removed.

SUMMARY OF THE INVENTION

The present invention provides a multi-output oscillator outputting multiple frequencies by multiplying a single frequency output from a single oscillator, dividing the frequency output from the single oscillator, and respectively mixing the multiplied frequency and the divided frequency with an oscillation frequency, thereby outputting a plurality of frequencies.

The present invention also provides a method of generating a multi-output.

According to an aspect of the present invention, there is provided a multi-output oscillator generating a plurality of output frequencies from a single frequency, the multi-output oscillator comprising: an oscillator outputting the single frequency; a multiplier multiplying the single frequency to output a first frequency; a first frequency divider dividing the single frequency by a first division factor; a first mixer outputting a second frequency by mixing an output of the first frequency divider and an output of the multiplier; a second frequency divider dividing the single frequency by a second division factor; a second mixer mixing the output of the second frequency divider and the output of the first mixer to output a third frequency; and a third mixer mixing the output of the second frequency divider and the output of the multiplier to output a fourth frequency.

According to another aspect of the present invention, there is provided a method of generating multiple outputs, the method comprising: generating a first frequency by multiplying a first single frequency; generating a first divided frequency by dividing the first single frequency by a first division factor; generating a second frequency by mixing the first divided frequency with the first frequency; generating a second divided frequency by dividing the first single frequency by a second division factor; coupling the first and second divided frequencies into a second single frequency; generating first through fourth frequencies by mixing the second single frequency with the second frequency; and generating fifth through eighth frequencies by mixing the second single frequency with the first frequency.

According to another aspect of the present invention, there is provided a method of generating multiple outputs, the method comprising: generating a first frequency by multiplying a first single frequency; generating a first divided frequency by dividing the first single frequency by a first division factor; generating a second frequency by mixing the first divided frequency with the first frequency; generating a second divided frequency by dividing the first single frequency by a second division factor; coupling the first and second divided frequencies into a second single frequency; generating first through fourth frequencies by mixing the second single frequency with the second frequency; and generating fifth through eight frequencies by mixing the second single frequency with the first frequency.

According to the present invention, a local oscillator with a plurality of output frequencies is designed by using a single oscillator, in a transceiver for multi-channel transmission. Thus interference due to image frequency is prevented between output frequencies and thus deterioration in the performance of the transceiver is little. Also, as signals having frequencies that are twice larger than a frequency separation are removed, it is easy to design a filter. Also, as one oscillator is used, the overall structure of a transceiver is simple and easy to realize the transceiver, and variation in the final output frequencies is uniform. Accordingly, influence regarding interference between channels due to frequency fluctuation can be reduced in the transceiver.

Also, a transceiver can be extended without changing the structure of the transceiver by which a final mixer therein converts a single signal to a multi-tone just by using a power coupler, thereby increasing the number of output frequencies.

BRIEF DESCRIPTION OF THE DRAWINGS

The above and other features and advantages of the present invention will become more apparent by describing in detail exemplary embodiments thereof with reference to the attached drawings in which:

FIG. 3 illustrates multiple frequencies generated by using the multi-output oscillator illustrated in FIG. 2;

FIGS. 4 and 5 respectively illustrate frequencies generated by mixers included in the multi-output oscillator illustrated in FIG. 2;

DETAILED DESCRIPTION OF THE INVENTION

Figure 1:
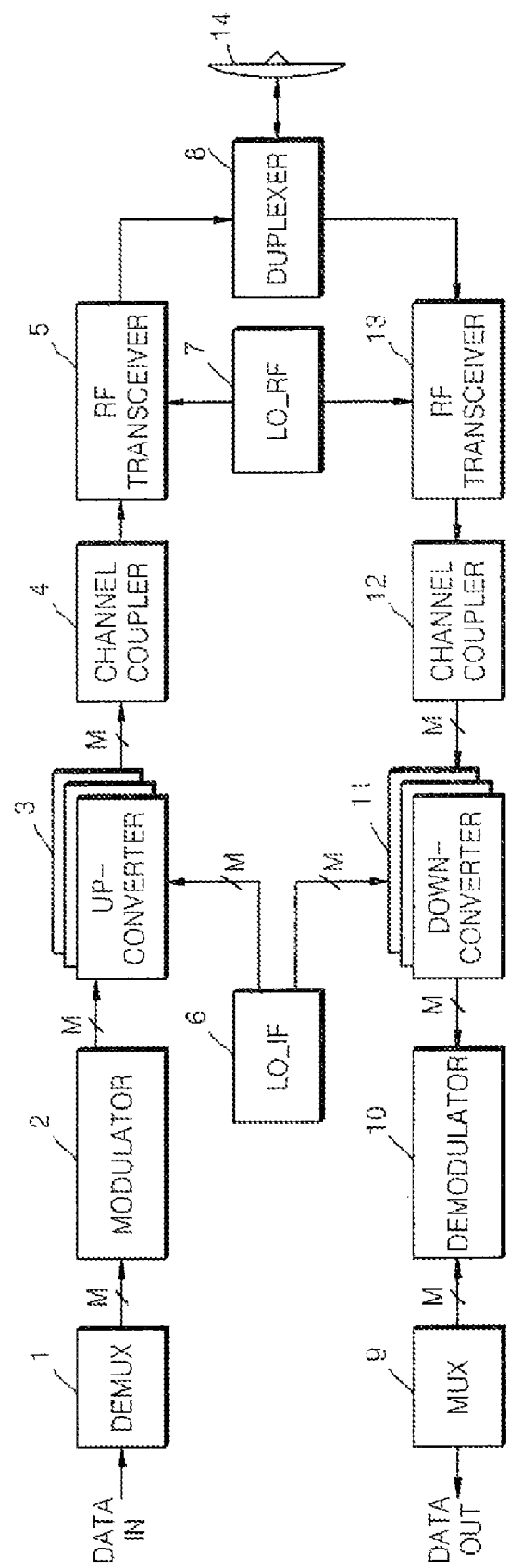
FIG. 1 illustrates a structure of a typical transceiver for multi-channel transmission.

The present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to those of ordinary skill in the art. Like reference numerals denote like elements throughout the specification.

FIG. 1 is a block diagram of a typical transceiver for multi-channel transmission. Referring to FIG. 1, input data is divided into multiple channels via a demultiplexer DEMUX 1 and respectively modulated by a plurality of modulators 2. An intermediate frequency up-converter 3 up-converts the modulated signals to previously determined intermediate frequency channels, by using frequencies output from a first local oscillator 6. A channel coupler 4 couples the upconverted channels to a single band, and a radio frequency (RF) transceiver 5 transmits the signal of single band through a duplexer 8 and an antenna 14 by using a frequency output from a second local oscillator 7.

In the case of reception, on the other hand, a signal input to the antenna 14 passes an RF receiver 13 and is downconverted to an intermediate frequency, and then a channel distributor 12 distributes the intermediate frequency signal into various channels, and an intermediate frequency down-converter 11 down-converts the distributed intermediate frequency signals to baseband signals by using output frequencies of the first local oscillator 6. A demodulator 10 demodulates the baseband signals into multiple channel data, and a multiplexer MUX 9 multiplexes the multiple channel data into a data.

Here, the first local oscillator 6, which is a multi-output intermediate frequency oscillator having different output frequencies, is required by the intermediate frequency up-converter 3 and down-converter 11 in order to convert signals to various frequencies determined for each of the channels.

Figure 2:
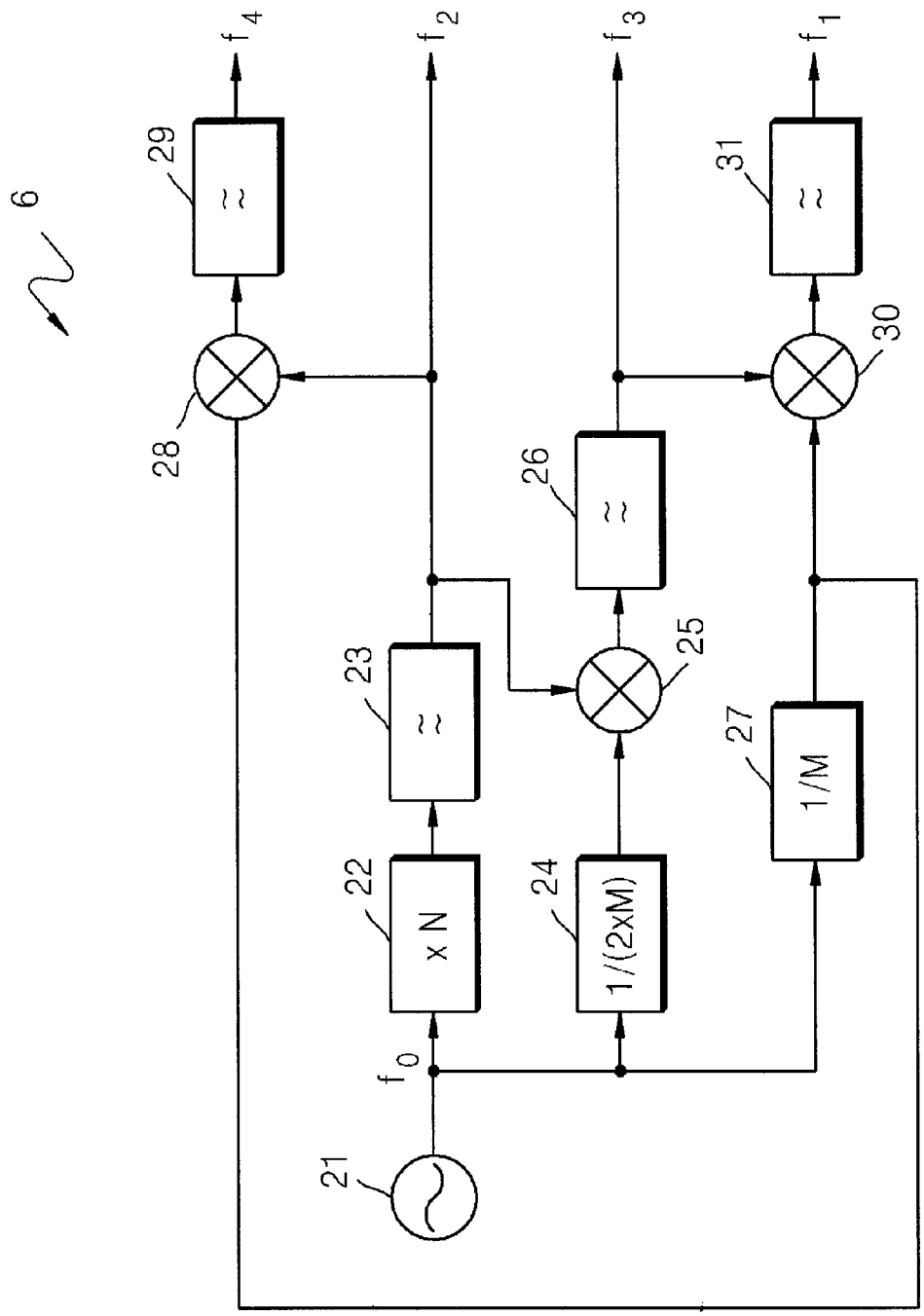
FIG. 2 is a block diagram of a multi-output oscillator according to an embodiment of the present invention.

FIG. 2 is a block diagram of a multi-output oscillator 6 according to an embodiment of the present invention. The multi-output oscillator 6 includes an oscillator 21, a frequency multiplier 22, first and second frequency dividers 24 and 27, first through fourth band pass filters (BPF) 23, 26, 29, and 31, and first through third mixers 25, 28, and 30. The oscillator 21 generates an oscillation signal by using a phase locked loop (PLL).

First, frequency f0 output from the oscillator 21 is multiplied N times through the frequency multiplier 22, passes the first BPF 23, and is converted to an output frequency f2.

The frequency f0 is divided by the first frequency divider 24, and is mixed with a first output frequency via the first mixer 25, passes the second BPF 26 to be an output frequency f3. Here, a frequency divided by the first frequency divider 24 becomes an interval between final output frequencies.

The frequency f0 is also divided by the second frequency divider 27 which has one-half smaller division factor than the first frequency divider 24, is mixed with the output frequency f3 through the second mixer 30, and passes the third BPF 31, and is thus converted to the output frequency f1.

Also, the frequency output from the second frequency divider 27 is also mixed with the output frequency f2 via the third mixer 28, passes through the fourth BPF 29, and is converted to an output frequency f4.

FIG. 3 illustrates multiple frequencies generated by using the multi-output oscillator 6 illustrated in FIG. 2. The multiple frequencies are configured to have the same frequency separations.

Here, if the multiplied output frequency f2 of f0, the base frequency of the oscillator 21, and the adjacent output frequency f3 are two of the final output frequencies, image frequencies $f2_{imag}$ and $f3_{img}$ which are output through the second and third mixer 28 and 30 exist outside a desired output frequency band as illustrated in FIG. 4.

Figure 5:
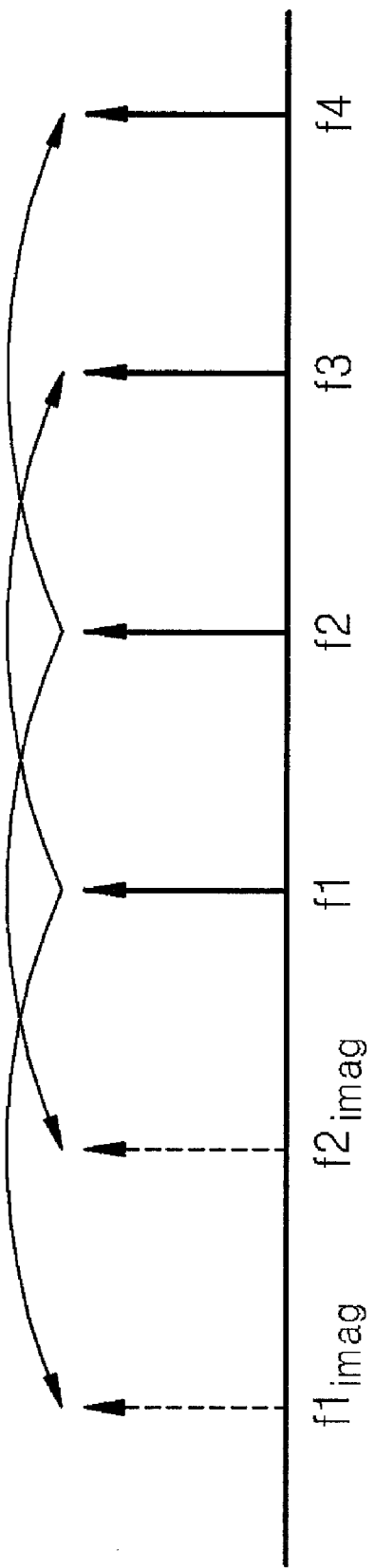

Even if the multiplied output frequency f2 of f0 and the adjacent output frequency f1 are either one signal among the final output frequencies, image frequencies $f1_{imag}$ and $f2_{img}$ generated by the second and third mixers 28 and 30 exist outside a desired frequency band as illustrated in FIG. 5, and do not affect other output frequency components.

In the above configuration, when the image components are used, a local oscillator having six outputs may be formed without changing other portions of the local oscillator.

Figure 6:
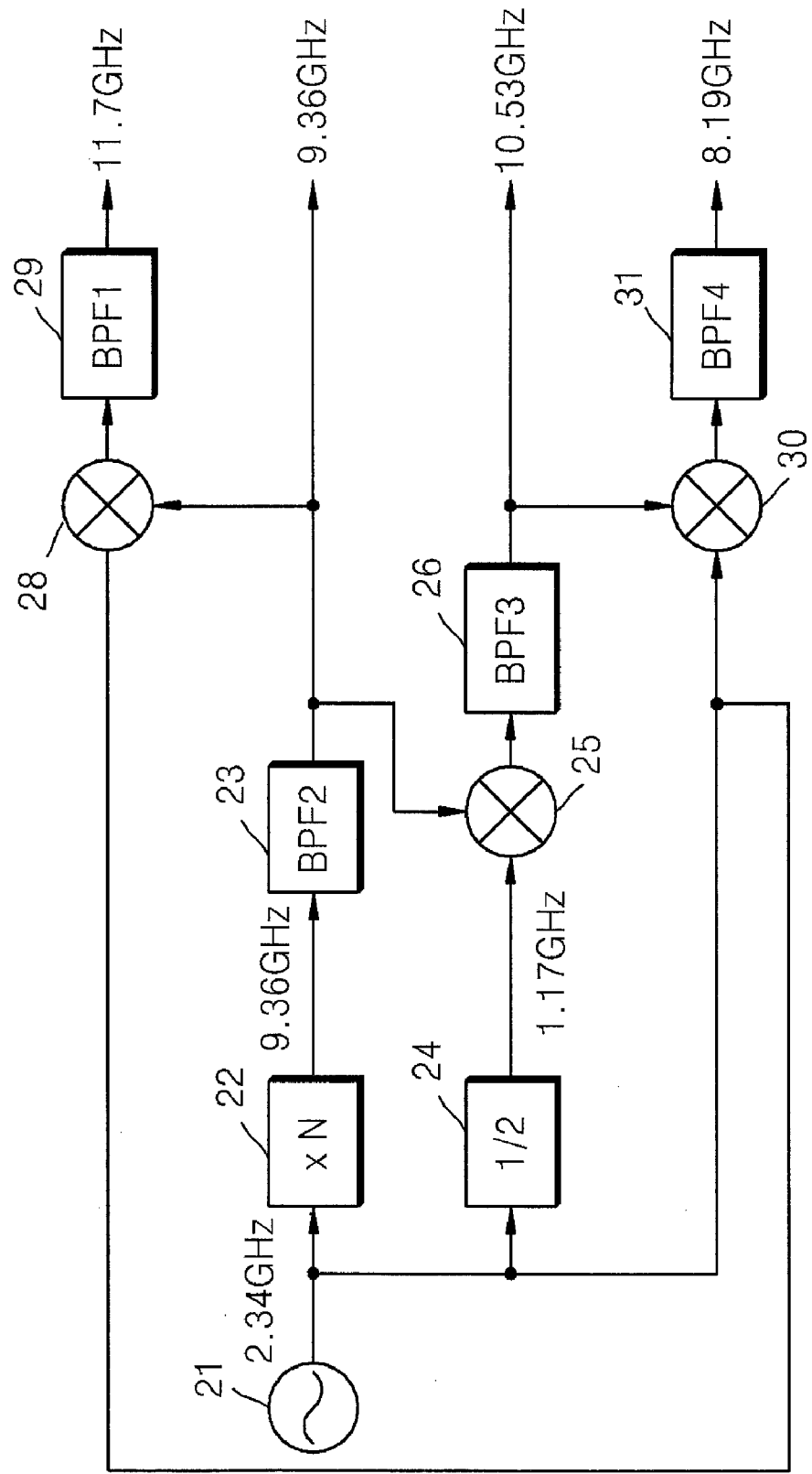
FIG. 6 illustrates a multi-output oscillator as shown in FIG. 2, having four outputs with an intermediate frequency of 10 GHz and a frequency separation of 1.17 GHz.

FIG. 6 illustrates a multi-output oscillator as shown in FIG. 2, having four outputs with an intermediate frequency of 10 GHz and a frequency separation of 1.17 GHz. Here, the multi-output oscillator of FIG. 6 has a multiplication factor N of 4 and a division factor M of 1. The multi-output oscillator of FIG. 6 may be applied to the transceiver illustrated in FIG. 1, and to a 5 GHz bandwidth available in 70/80 GHz, which is distributed worldwide.

Figure 7:
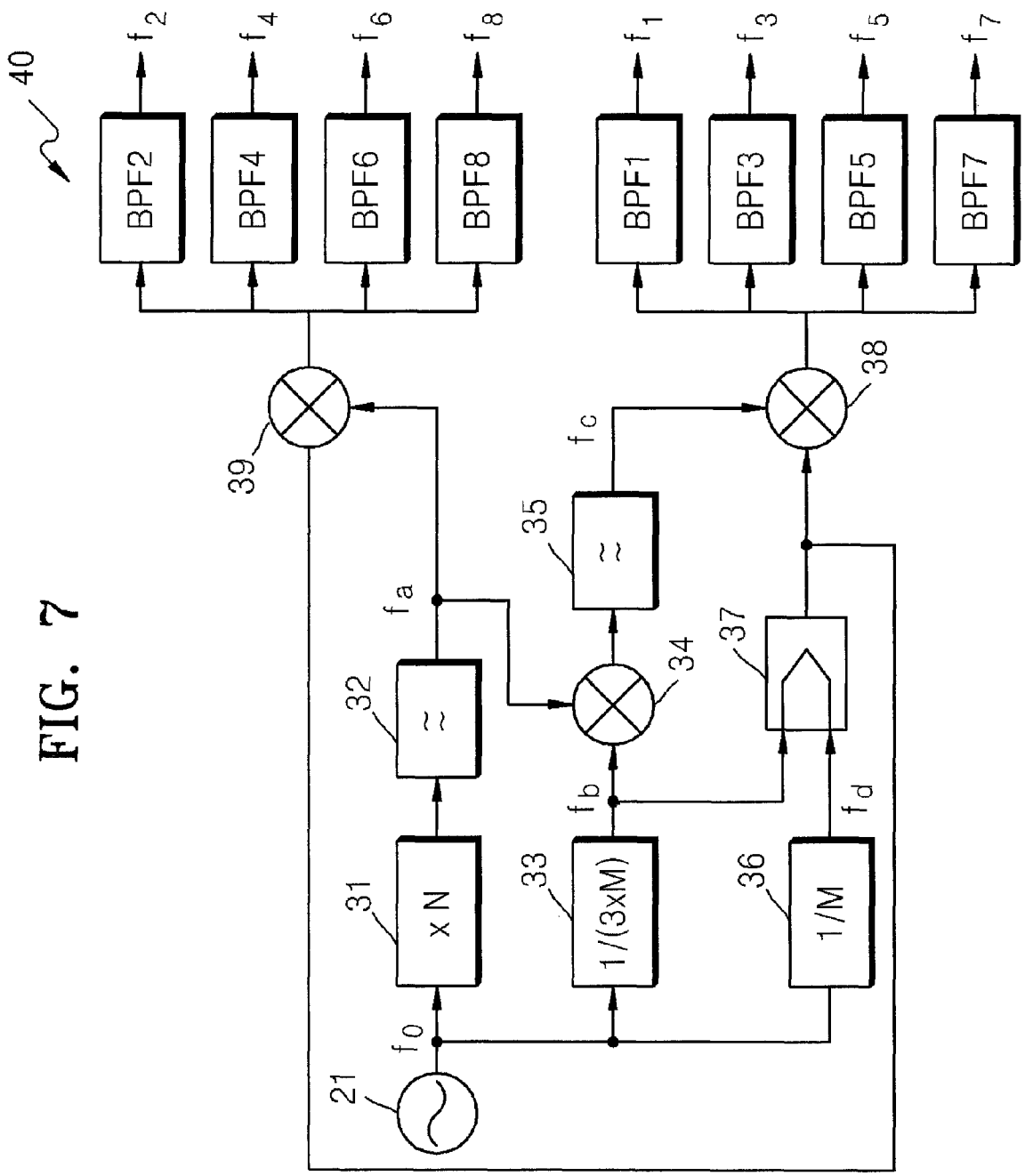
FIG. 7 illustrates an extended structure of the multi-output oscillator of FIG. 2 with eight output frequencies.

FIG. 7 illustrates an extended structure of the multi-output oscillator of FIG. 2 with eight output frequencies. The multi-output oscillator of FIG. 7 includes an oscillator 21, a multiplier 31, first and second frequency dividers 33 and 36, first and second BPFs 32 and 35, first through third mixers 34, 38, and 39, and a power coupler 37, and a BPF bank 40. The oscillator 21 generates an oscillation signal by using a PLL.

Frequency f0 output from the oscillator 21 is multiplied N times through the multiplier 31, and passes through the first BPF 32 to be a first intermediate frequency fa. The multiplied frequency is one of those central frequencies among the total output frequencies.

The frequency f0 is divided by the first frequency divider 33 and is converted to a second intermediate frequency fb, and is mixed with the frequency fa through the first mixer 34, passes through the second BPF 35 to be a third intermediate frequency fc. Here, a frequency division factor of the first frequency divider 33 is determined such that the divided frequency becomes an interval between the final output frequencies.

Also, the frequency f0 is divided by the second frequency divider 36 which has one-third smaller division factor than the first frequency divider 33 to be a fourth intermediate frequency fd, and is coupled with the frequency fb through the power coupler 37 to form to a multi-tone frequency. The multi-tone frequency is mixed with the third intermediate frequency fc through the second mixer 38 and passes through the BPF bank 40 according to each frequency to be four output frequencies f1, f3, f5, and f7.

Also, the multitone frequency output from the power coupler 37 is mixed with the first intermediate frequency fa through the third mixer 39, passes through the BPF bank 40 to be four output frequencies f2, f4, f6, and f8.

Figure 8:
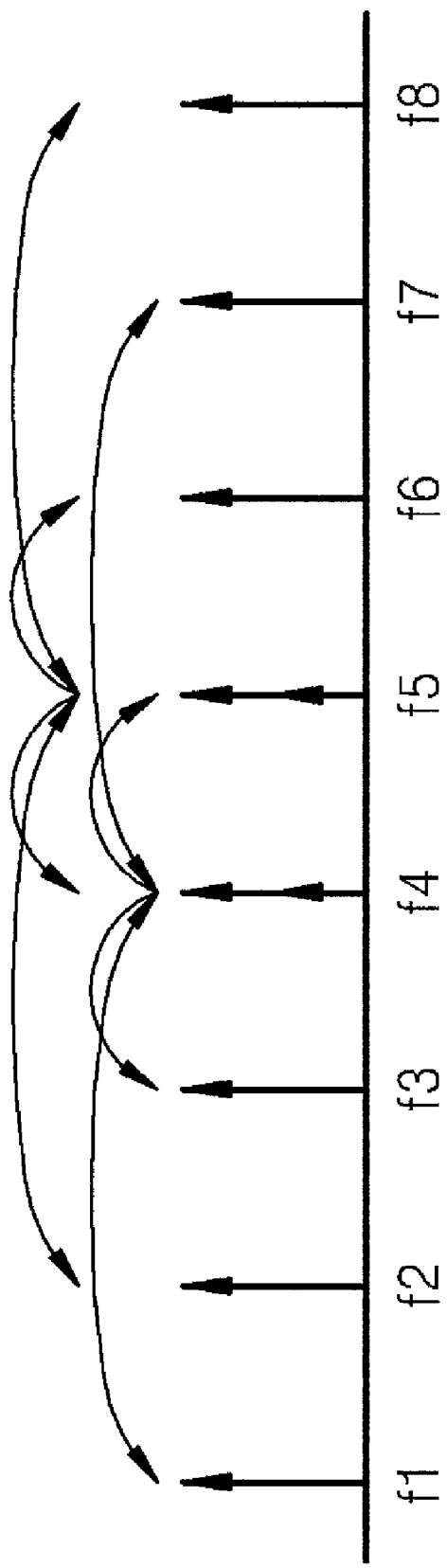
FIG. 8 illustrates output frequencies of the multi-output oscillator illustrated in FIG. 7.

FIG. 8 illustrates output frequencies of the multi-output oscillator illustrated in FIG. 7. Referring to FIG. 8, the frequencies generated by the second and third mixers 38 and 39 illustrated in FIG. 7 are output in an alternating manner from a point of view of a final output frequency spectrum, not overlapped in a mixer output.

Figure 9:
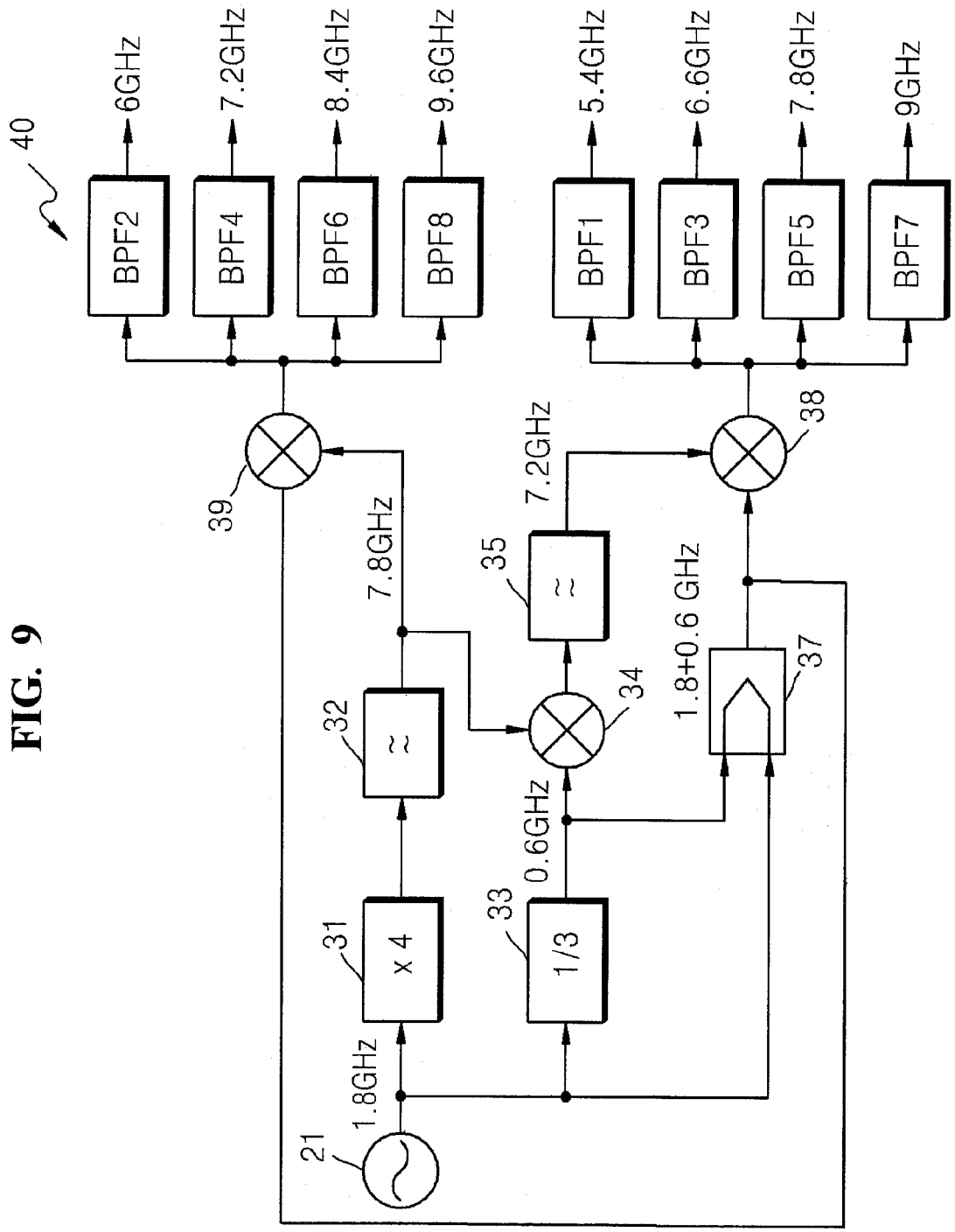
FIG. 9 illustrates a multi-output oscillator as shown in FIG. 7, having eight outputs with an intermediate frequency of 7.5 GHz and a frequency separation of 600 MHz.

FIG. 9 illustrates a multi-output oscillator as shown in FIG. 7, having outputs with an intermediate frequency of 7.5 GHz and a frequency separation of 600 MHz. The multi-output oscillator of FIG. 9 has a multiplication factor N of 4 and a frequency division factor M of 1. The multi-output oscillator of FIG. 9 may be applied to the general transceiver illustrated in FIG. 1, and to a 5 GHz bandwidth available at 70/80 GHz, which is distributed worldwide.

While the present invention has been particularly shown and described with reference to exemplary embodiments thereof and the terminology including particular terms are used herein, it is for the purpose of describing particular embodiments only and is not intended to be limiting of example embodiments. Accordingly, it will be understood by those of ordinary skill in the art that various changes in form and details may be made therein. Therefore, the scope of the invention is defined by the appended claims.

What is claimed is:

1. A multi-output oscillator generating a plurality of output frequencies from a single frequency, the multi-output oscillator comprising:
an oscillator outputting the single frequency;
a multiplier multiplying the single frequency to output a first frequency;
a first frequency divider dividing the single frequency by a first division factor;
a first mixer outputting a second frequency by mixing an output of the first frequency divider and an output of the multiplier;
a second frequency divider dividing the single frequency by a second division factor;
a second mixer mixing the output of the second frequency divider and the output of the first mixer to output a third frequency; and
a third mixer mixing the output of the second frequency divider and the output of the multiplier to output a fourth frequency.

2. The multi-output oscillator of claim 1, wherein the first through fourth frequencies are separated apart with an equal interval.

3. The multi-output oscillator of claim 2, wherein the first division factor is determined so as to output a frequency corresponding to the interval between the first through fourth frequencies.

4. The multi-output oscillator of claim 2, further comprising a plurality of band pass filters next to each of the first through third mixers, wherein each of the band pass filters passes a desired frequency among the two outputs of each of the first through third mixers.

5. The multi-output oscillator of claim 1, further comprising a power coupler between the second frequency divider and the second mixer so as to couple the output of the first frequency divider and the output of the second frequency divider, wherein an output of the power coupler is a multi-tone frequency and is respectively output to both the second mixer and the third mixer.

6. The multi-output oscillator of claim 5, wherein the second mixer mixes the third frequency and the output of the power coupler to output first through fourth output frequencies, and the third mixer mixes the first frequency and the output of the power coupler to output fifth through eighth output frequencies.

7. The multi-output oscillator of claim 6, wherein the first through eighth output frequencies are separated apart with an equal interval.

8. The multi-output oscillator of claim 7, wherein the first division factor is determined so as to divide the single frequency and output a frequency corresponding to the interval between the first through eighth output frequencies.

9. The multi-output oscillator of claim 6, further comprising a plurality of band pass filters which are connected in parallel to one another and next to each of the second and third mixers in order to pass frequencies required for outputting a plurality of frequencies.

10. A method of generating multiple outputs, the method comprising: generating a first frequency by multiplying a single frequency;
generating a first divided frequency by dividing the single frequency by a first division factor;
generating a second frequency by mixing the first divided frequency with the first frequency;
generating a second divided frequency by dividing the single frequency by a second division factor;
a third frequency by mixing the second divided frequency with the second frequency; and
generating a fourth frequency by mixing the second divided frequency with the first frequency.

11. The method of claim 10, wherein the first through fourth frequencies are separated apart with an equal interval and the first divided frequency is equal to the interval.

12. A method of generating multiple outputs, the method comprising:
generating a first frequency by multiplying a first single frequency;
generating a first divided frequency by dividing the first single frequency by a first division factor;
generating a second frequency by mixing the first divided frequency with the first frequency;
generating a second divided frequency by dividing the first single frequency by a second division factor;

coupling the first and second divided frequencies into a multi-tone frequency;
generating first through fourth frequencies by mixing the multi-tone frequency with the second frequency; and
generating fifth through eighth frequencies by mixing the multi-tone frequency with the first frequency.

13. The method of claim 12, wherein the first through eighth frequencies are separated apart with an equal interval and the first divided frequency is equal to the interval.

* * * * *